United States Patent
Chen et al.

(10) Patent No.: US 6,596,643 B2
(45) Date of Patent: Jul. 22, 2003

(54) CVD TISIN BARRIER FOR COPPER INTEGRATION

(75) Inventors: Ling Chen, Sunnyvale, CA (US); Christophe Marcadal, Santa Clara, CA (US); Hyungsuk Alexander Yoon, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/851,519

(22) Filed: May 7, 2001

(65) Prior Publication Data

US 2003/0022507 A1 Jan. 30, 2003

(51) Int. Cl.$^7$ ..................... H01L 21/302; H01L 21/461
(52) U.S. Cl. ........................... 438/706; 438/791
(58) Field of Search ................. 438/656, 680, 438/681, 685, 706, 909, 724, 744, 791

(56) References Cited

U.S. PATENT DOCUMENTS

| | | | |
|---|---|---|---|
| 5,970,378 A | * 10/1999 | Shue et al. | |
| 6,017,818 A | 1/2000 | Lu | 438/653 |
| 6,037,013 A | 3/2000 | Hsu et al. | 427/535 |
| 6,129,044 A | 10/2000 | Zhao et al. | 118/715 |
| 6,144,096 A | 11/2000 | Lopatin | 457/751 |
| 6,149,777 A | 11/2000 | Ngan et al. | 204/192.17 |
| 6,433,433 B1 | * 8/2002 | Sengupta | |

FOREIGN PATENT DOCUMENTS

EP 0 818 559 A2 1/1998 ........... C23C/16/44

OTHER PUBLICATIONS

T. Harada, S. Hirao, S. Fuji, S. Hashimoto and S. Shishino. Surface Modification of MOCVD–TiN Film by Plasma Treatment and SiH4 Exposure for Cu Interconnects. Materials Research Society Conference Proceedings ULSI XIV pp. 329–335. (1999).

* cited by examiner

*Primary Examiner*—David Nelms
*Assistant Examiner*—Phuc T. Dang
(74) *Attorney, Agent, or Firm*—Moser, Patterson & Sherdian LLP

(57) ABSTRACT

The present invention provides a method of forming a titanium silicon nitride barrier layer on a semiconductor wafer, comprising the steps of depositing a titanium nitride layer on the semiconductor wafer; plasma-treating the titanium nitride layer in a $N_2/H_2$ plasma; and exposing the plasma-treated titanium nitride layer to a silane ambient, wherein silicon is incorporated into the titanium nitride layer as silicon nitride thereby forming a titanium silicon nitride barrier layer. Additionally, there is provided a method of improving the barrier performance of a titanium nitride layer comprising the step of introducing silicon into the titanium nitride layer such that the silicon is incorporated into the titanium nitride layer as silicon nitride. Also provided is a method of integrating copper into a semiconductor device and a method of improving copper wettability at a copper/titanium nitride interface in a semiconductor device.

20 Claims, 13 Drawing Sheets

N2 Purge
SiH4

Modified for 2nd gas feed thru

1x50 TiN Plasma

1x50 TiSiN Plasma

CVD TISIN BARRIER FOR COPPER INTEGRATION

BACKGROUND OF THE INVENTION

1. Field of the Invention

The present invention relates generally to the field of semiconductor manufacturing. More specifically, the present invention relates to a method of achieving low contact resistance and to improving titanium nitride barrier performance for copper integration.

2. Description of the Related Art

With the down-scaling and increased speed of semiconductor devices being fabricated currently and with the levels of integration in VLSI and ULSI integrated chips, metallization processes require low resistance metals. Traditionally, aluminum has been used for interconnects in semiconductor devices, but recently, copper, with its lower resistance and better electromigration lifetime than that of aluminum, has been used for integration. However, copper is very mobile in many of the materials used to fabricate semiconductor devices. Copper can diffuse quickly through certain materials including dielectrics such as oxides. This causes damage to nearby devices on the semiconductor substrate. Thus, it is necessary to have copper barrier layers in place to avoid any copper diffusion within the semiconductor device.

Titanium nitride layers can serve as barrier layers against diffusion, including copper diffusion, in semiconductor device structures, e.g., contacts, vias and trenches. Deposition of an effective and useable titanium nitride barrier layer realizes good step coverage, sufficient barrier thickness at the bottom of device features and a conformal film having a smooth surface for further processing steps. However the TiN barrier layer must be as thin as possible to accommodate the higher aspect ratios of today's devices. Additionally, the TiN barrier layer must be inert and must not adversely react with adjacent materials during subsequent thermal cycles, must prevent the diffusion or migration of adjacent materials through it, must have low resistivity (exhibit high conductivity), low contact or via resistance and low junction leakage.

Titanium nitride layers can be deposited on a wafer by the rapid thermal nitridation of a titanium layer or by any deposition process, e.g., sputtering (PVD) and CVD. CVD deposition of titanium nitride barrier films eliminates the problems with metal reliability and junction leakage associated with PVD deposited TiN barrier films and is considered a cleaner process than PVD TiN. Additionally, the CVD process produces conformal films with good step coverage in the 0.35 micron or less structures found in state of the art VLSI and ULSI devices. In a CVD process a metalorganic precursor such as tetrakisdimethylamino titanium (TDMAT) or tetrakisdiethylamino titanium (TDEAT) is thermally decomposed to deposit a titanium nitride layer.

However, MO CVD TiN does not have as good barrier performance to copper diffusion as, for example, IMP tantalum or IMP tantalum nitride. This film contains carbon and is a porous film that easily absorbs oxygen thereby becoming highly resistive and unstable. It is critical to have an effective barrier with copper metallization. Electromigration of copper into the silicon substrate ruins device performance.

Barrier performance of a TiN film can be improved by altering the method of deposition and/or the components of the film. Titanium nitride sputtered by using high density plasma techniques, such as those where a relatively large proportion of the material sputtered from the target is ionized and electrically attracted to the substrate, has produced smooth conformal films with low resistivity for subsequent aluminum deposition thereon. Titanium-silicon-nitrogen compounds provide a better diffusion barrier for aluminum or copper interconnects than titanium nitride barriers. Silane is used to incorporate silicon into a MOCVD TiN film in such a manner that a silicon rich surface is formed on the titanium nitride. This method does not utilize an in situ plasma step to further improve the film properties of the titianium nitride layer and the silicon is primarily deposited on the surface of the underlying titanium nitride layer.

Additionally, a high temperature method to deposit a porous titanium nitride layer with subsequent exposure firstly to a silicon-containing gas ambient and secondly to a low plasma power generated $N_2/H_2$ plasma incorporates silicon, as silicon nitride, primarily on the surface of the titanium nitride film. However, lower wafer temperatures are desired, as previously deposited material may have critical heat and temperature limitations. For example, current generation low k dielectric materials require wafer temperatures below approximately <380–400 ° C. Also, higher rf power can provide for efficient film treatment realizing low film resistivity and via resisance and providing for faster throughput. Thus, there exists a need in the art to further improve the barrier performance of titanium films for subsequent copper integration.

Therefore, a need exists for an improved effective means of improving titanium nitride barrier performance for copper integration. Specifically, there is a lack of effective means of incorporating silicon as silicon nitride into a titanium nitride layer thereby improving barrier performance for copper integration. The present invention fulfills these long-standing needs and desires in the art.

SUMMARY OF THE INVENTION

One embodiment of the present invention provides a method of forming a titanium silicon nitride barrier layer on a semiconductor wafer, comprising the steps of depositing a titanium nitride layer on the semiconductor wafer; plasma-treating the titanium nitride layer in a $N_2/H_2$ plasma; and exposing the plasma-treated titanium nitride layer to a silicon-containing gas ambient, wherein silicon is incorporated into the titanium nitride layer as silicon nitride thereby forming a titanium silicon nitride barrier layer.

Another embodiment of the present invention provides a method of forming a titanium silicon nitride barrier layer on a semiconductor wafer, comprising the steps of vaporizing a tetrakisdimethylamino titanium; introducing the vaporized tetrakisdimethylamino titanium into a deposition chamber of a CVD apparatus; maintaining the deposition chamber at a pressure of about 5 Torr and the wafer at a temperature of about 360° C.; thermally decomposing the tetrakisdimethylamino titanium gas in the deposition chamber; vapor-depositing the titanium nitride film onto the wafer; plasma-treating the titanium nitride layer in a $N_2/H_2$ plasma at a plasma power of about 750W for about 35 seconds wherein a single titanium nitride layer having a thickness of about 50 Å is formed; and exposing the plasma-treated titanium nitride layer to a silane gas ambient for about 10 seconds, wherein silicon is incorporated into the titanium nitride layer as silicon nitride thereby forming a titanium silicon nitride barrier layer.

Yet another embodiment of the present invention provides a method of improving the barrier performance of a titanium nitride layer comprising the step of introducing silicon into the titanium nitride layer such that the silicon is incorporated into the titanium nitride layer as silicon nitride wherein the barrier performance of the titanium nitride layer is improved.

In yet another embodiment of the present invention there is provided a method of improving the barrier performance of a titanium nitride layer comprising the steps of vaporizing tetrakisdimethyl amino titanium; introducing the vaporized tetrakisdimethylamino titanium into a deposition chamber of a CVD apparatus; maintaining the deposition chamber at a pressure of about 5 Torr and the wafer at a temperature of about 360° C.; thermally decomposing the tetrakisdimethylamino titanium gas in the deposition chamber; vapor-depositing the titanium nitride film onto the wafer; plasma-treating the titanium nitride layer in a $N_2/H_2$ plasma at a plasma power of about 750W for about 35 seconds wherein a single titanium nitride layer having a thickness of about 50 Å is formed; and exposing the plasma-treated titanium nitride layer to a silane gas ambient for about 10 seconds, wherein silicon is incorporated into the titanium nitride layer as silicon nitride thereby improving the barrier performance of the titanium nitride layer.

In yet another embodiment of the present invention there is provided a method of integrating copper into a semiconductor device comprising the steps of forming a titanium silicon nitride barrier in a feature of the semiconductor device by the methods disclosed supra and depositing a copper layer over the titanium silicon nitride barrier thereby integrating copper into the semiconductor device.

In yet another embodiment of the present invention there is provided a method of improving copper wettability at an interface of a copper layer and a titanium nitride layer in a semiconductor device comprising the steps of introducing silicon into the titanium nitride layer as silicon nitride by the methods disclosed supra such that that a titanium silicon nitride layer is formed; and depositing a copper layer over the titanium silicon nitride layer wherein copper wettability at the interface of the copper layer and the titanium silicon nitride layer is improved over copper wettability at the copper/titanium nitride interface.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIG. 3 shows silane flow-time experiments measuring sheet resistance as the duration of air exposure increases for differing silane exposure times. Films are plasma treated for 30 secs.

DETAILED DESCRIPTION OF THE INVENTION

Figure 1A:
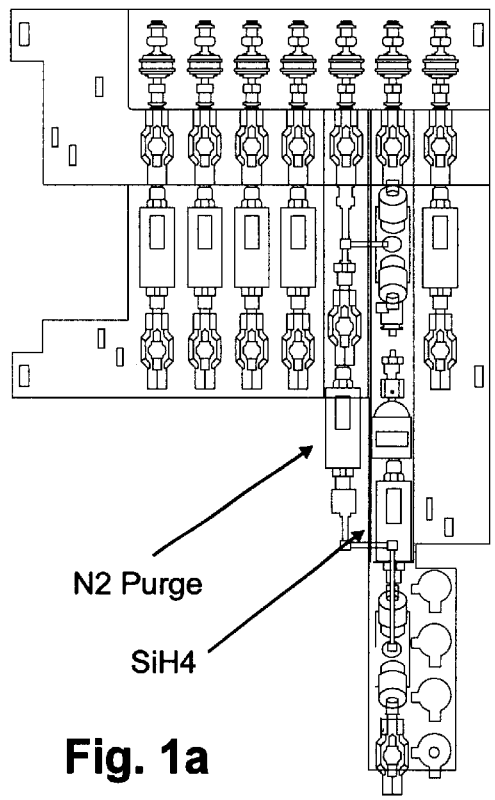
FIG. 1 is a partial schematic of a HP+TxZ chamber slowing how the silane line is introduced into the chamber through a line separate from that of nitrogen (FIG. 1A) and of the HP+TxZ modified chamber lid showing the two gas line spaces for silane and nitrogen in the gas box (FIG. 1B).

One embodiment of the present invention provides a method of forming a titanium silicon nitride barrier layer on a semiconductor wafer, comprising the steps of depositing a titanium nitride layer on the semiconductor wafer; plasma-treating the titanium nitride layer in a $N_2/H_2$ plasma; and exposing the plasma-treated titanium nitride layer to a silane ambient, wherein silicon is incorporated into the titanium nitride layer as silicon nitride thereby forming a titanium silicon nitride barrier layer.

In one aspect of this embodiment the titanium nitride layer is deposited by a method comprising the steps of vaporizing a metalorganic titanium/nitrogen-containing compound; introducing the vaporized titanium/nitrogen-containing compound into a deposition chamber of a CVD apparatus; maintaining the deposition chamber at a pressure and the wafer at a temperature suitable for the high pressure chemical vapor deposition of the titanium nitride film onto the wafer; thermally decomposing the titanium/nitrogen-containing gas in the deposition chamber; and vapor-depositing the titanium nitride film onto the wafer.

In this aspect of the present invention the metalorganic compound may be tetrakisdimethylamino titanium or tetrakisdiethylamino titanium. The deposited titanium nitride layer can have a thickness of 5 Å to 100 Å. A representative thickness is about 50 Å. Generally, the deposition chamber pressure can be from about 1 Torr to about 10 Torr. A representative example is 5 Torr. The wafer temperature can be from about 320° C. to about 420° C. A representative example is about 360° C. The titanium nitride layer is plasma treated at a plasma power of about 600 to about 1500W. A representative example is about 750W plasma treatment in about 15 seconds to about 40 seconds with 35 seconds being a representative example. The silicon-containing gas may be silane, disilane, methylsilane, or dimethylsilane. Exposure to the silicon-containing gas ambient is from about 4 seconds to about 20 seconds with ten seconds as a representative example for duration of exposure.

In another aspect of this embodiment of the present invention the titanium nitride layer may be deposited and plasma-treated incrementally without an intervening step prior to exposure of the layer to a silane ambient. A representative number of such cycles is two with both cycles depositing a titanium nitride layer having a thickness of about 5 Å to about 50 Å with 25 Å being a representative example. Plasma treatment of these titanium nitride layers is from about 5 seconds to 30 seconds with 15 seconds being a representative example.

Another embodiment of the present invention provides a method of forming a titanium silicon nitride barrier layer on a semiconductor wafer, comprising the steps of vaporizing tetrakisdimethylamino titanium; introducing the vaporized tetrakisdimethylamino titanium into a deposition chamber of a CVD apparatus; maintaining the deposition chamber at a pressure of about 5 Torr and the wafer at a temperature of about 360° C.; thermally decomposing the tetrakisdimethylamino titanium gas in the deposition chamber; vapor-depositing the titanium nitride film onto the wafer; plasma-treating the titanium nitride layer in a $N_2/H_2$ plasma at a plasma power of about 750W for about 35 seconds wherein a single titanium nitride layer having a thickness of about 50 Å is formed; and exposing the plasma-treated titanium nitride layer to a silane gas ambient for about 10 seconds, wherein silicon is incorporated into the titanium nitride layer as silicon nitride thereby forming a titanium silicon nitride barrier layer.

Yet another embodiment of the present invention provides a method of improving the barrier performance of a titanium nitride layer comprising the step of introducing silicon into the titanium nitride layer such that the silicon is incorporated into the titanium nitride layer as silicon nitride so that the barrier performance of the titanium nitride layer is improved. The titanium nitride layer and the incorporation of silicon as silicon nitride therein can be accomplished by the methods disclosed supra.

In an aspect of this embodiment of the present invention the titanium nitride layer may be deposited and plasma-treated incrementally without an intervening step prior to exposure of the layer to a silane ambient using the methods and examples disclosed supra for such incremental deposition.

In yet another embodiment of the present invention there is provided a method of improving the barrier performance of a titanium nitride layer comprising the steps of vaporizing tetrakisdimethylamino titanium; introducing the vaporized tetrakisdimethylamino titanium into a deposition chamber of a CVD apparatus; maintaining the deposition chamber at a pressure of about 5 Torr and the wafer at a temperature of about 360° C.; thermally decomposing the tetrakisdimethylamino titanium gas in the deposition chamber; vapor-depositing the titanium nitride film onto the wafer; plasma-treating the titanium nitride layer in a $N_2/H_2$ plasma at a plasma power of about 750 W for about 35 seconds wherein a single titanium nitride layer having a thickness of about 50 Å is formed; and exposing the plasma-treated titanium nitride layer to a silane gas ambient for about 10 seconds, wherein silicon is incorporated into the titanium nitride layer as silicon nitride thereby improving the barrier performance of the titanium nitride layer.

In yet another embodiment of the present invention provides a method of integrating copper into a semiconductor device comprising the steps of forming a titanium silicon nitride barrier in a feature of the semiconductor device by the methods disclosed supra and depositing a copper layer over the titanium silicon nitride barrier thereby integrating copper into the semiconductor device.

In yet another embodiment of the present invention there is provided a method of improving copper wettability at an interface of a copper layer and a titanium nitride layer in a semiconductor device comprising the steps of introducing silicon into the titanium nitride layer as silicon nitride by the methods disclosed supra such that a titanium silicon nitride layer is formed; and depositing a copper layer over the titanium silicon nitride layer wherein copper wettability at the interface of the copper layer and the titanium silicon nitride layer is improved over copper wettability at the copper/titanium nitride interface.

Barrier performance of a titanium nitride layer is improved with the addition of silicon, as primarily SiN, inside the TiN layer. This is accomplished by exposing the titanium nitride film to a silicon-containing gas ambient. Such an ambient can be a silane, a disilane, a methylsilane, or a dimethylsilane ambient. A silane soak of the titanium nitride layer allows silicon to be incorporated into the layer to form the silicon nitride. However, the plasma duration and the silane treatment need to be adjusted in order to incorporate the silicon as silicon nitride and not free silicon. The TiN treatment is optimized to allow the silane to react fully with the film where the precursor is not fully reacted but not to degrade copper resistivity.

The silane reacts with the non-fully reacted molecule of TDMAT incorporated into the film. It breaks the N—C bond and forms a SiN bond in the film. Non-fully reacted means that, during the thermal decomposition of the precursor TDMAT, not all of the CH3 groups are eliminated, thus $TiNCH_3$ bonds remain in the film. During the plasma treatment the concentration in carbon decreases because the $NCH_3$ groups are replaced by the nitrogen from the plasma. Therefore a plasma treated film reacts less with silane than a non-plasma treated film.

In order to achieve a good barrier, SiN bonds in the amorphous matrix around the TiN nanocrystallite need to be maximized, but at the same time unreacted silane needs to be prevented from subsequently reacting with the copper and thereby forming a solid solution of copper and silicon or, even worse, a precipitate of copper silicide as both compounds have high resistivity.

If this is not the case, the silicon migrates during annealing inside the copper which leads to poor contact resistance. However, if the TiN is not plasma treated sufficiently, carbon remains in the film and the material resistivity remains high and results in high contact resistance. Both plasma duration as well as the silane treatment conditions (duration, dilution and pressure) must be optimized in order to minimize the contact resistance impact of silane treatment and to achieve the best barrier properties.

The following examples are given for the purpose of illustrating various embodiments of the invention and are not meant to limit the present invention in any fashion.

EXAMPLE 1
200 mm TxZ Chamber Modifications

A high-pressure process in a standard Applied Materials TxZ chamber is used for formation of the titanium nitride barrier layer. Low-resistivity titanium nitride thin-films are thermally deposited using a high-pressure MOCVD process. TDMAT is currently used as a precursor although TDEAT, among others, can also be used. The TiN thin film is subsequently plasma post treated with an $H_2/N_2$ plasma generated by a high plasma power of from 600 to 1500 Watts in order to reduce the film resistivity. Following the plasma post treatment, the layer is exposed to a silane soak.

Figure 1B:
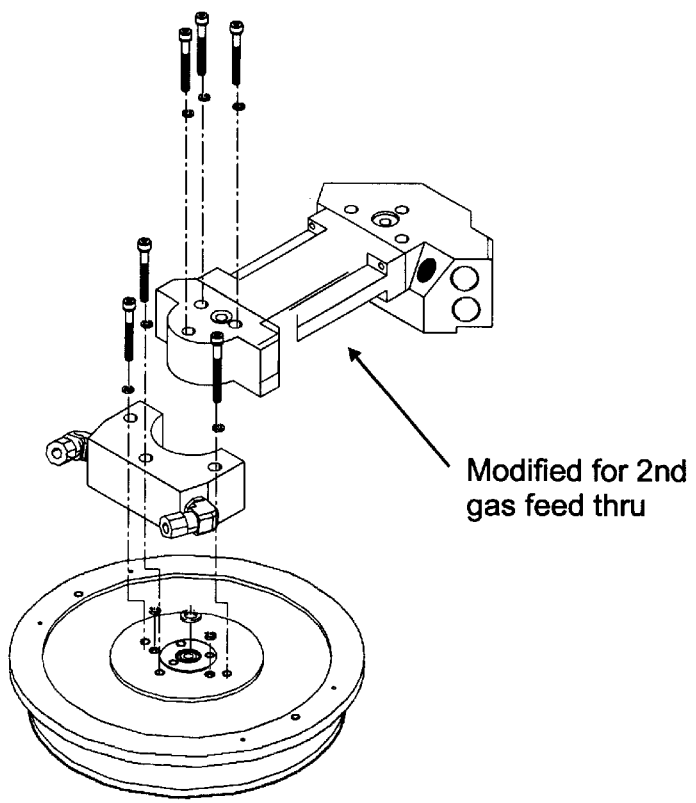

In order to accomplish this TiSiN process, the hardware is built based on a TxZ chamber where $SiH_4$ is introduced through a second line into the chamber separate from the TDMAT line (FIG. 1A). In this configuration the 200 mm TxZ gas box has two gas line spaces for silane and nitrogen. The chamber lid is modified so that the gas pass through parts accommodate silane gas separately via a second gas feed (FIG. 1B).

The TxZ chamber hardware is also modified to include an independent line with purge capability. Thus, pump purge time is optimized and silane residue in the chamber is avoided. This residue reacts with the copper at the surface of the next wafer and causes particle formation and high resistivity. The chamber can be set up as follows:
Precursors: TDMAT TDEAT
Carrier gases: Ar, N2, He
Chamber pressure: 1 to 10 Torr
Wafer temperature: 320° C. to 370° C.

EXAMPLE 1
Overview of the Formation of TiSiN Barrier Layer

Figure 2:
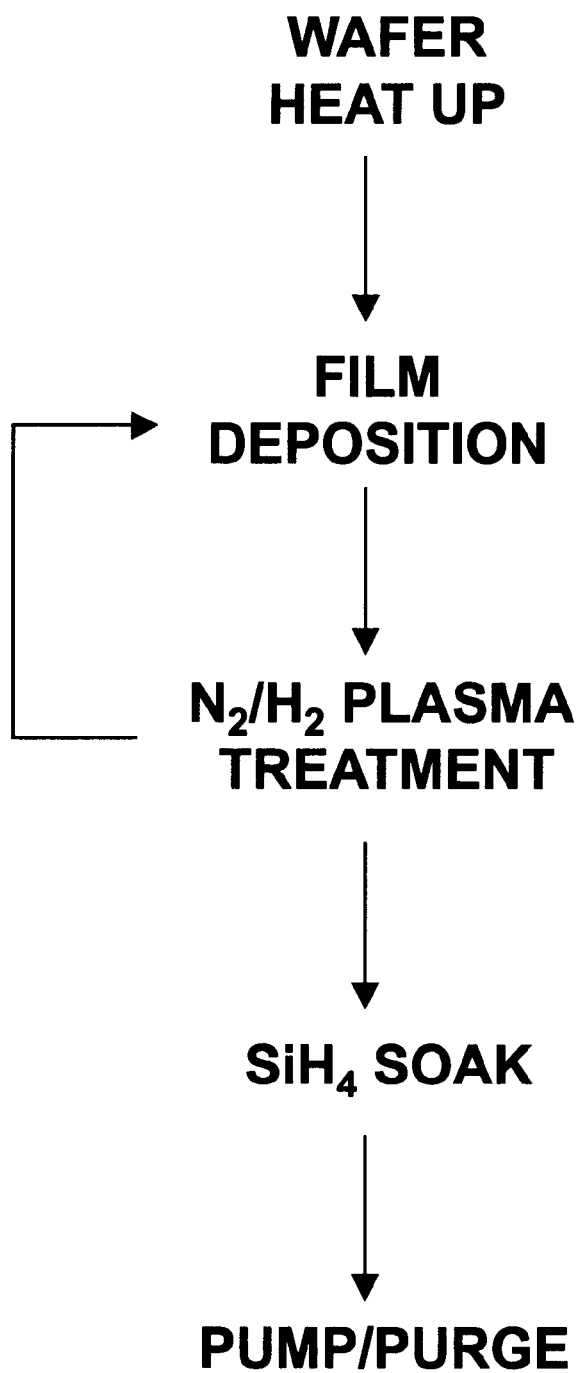
FIG. 2 is a flow diagram of the MOCVD TiSiN process.

The formation of the TiSiN barrier layer comprises a basic three step process as shown in FIG. 2. TDMAT is vaporized and, upon heating of the wafer, is thermally decomposed as a film deposited on the wafer at a low temperature of about 360° C. which corresponds to a heater temperature of about 380° C. and at a high chamber pressure of 5 Torr. The process can be run with low wafer temperatures ranging from about 320° C. to about 370° C. and chamber pressures ranging from about 1 to about 10 Torr.

The decomposition rate of TDMAT is controlled by various process conditions. The step coverage and the deposition rates depend on the wafer temperature. As the decomposition of TDMAT is a pyrolytic process, the rate of decomposition and thereby the rate of depositon on the wafer increases with the wafer temperature. It is possible to compensate for the loss in deposition rate at a low temperature by an increase in precursor delivery. The deposition temperature is dependant on the type of application, e.g., the type of low K dielectric needed. However, a spacing change affects wafer temperature and thus the deposition rate is affected. Concomitantly, an increase in chamber pressure and/or an increase in TDMAT flow will increase the deposition rate. Additionally, increasing the $N_2$ or He carrier gas dilution flow will decrease the deposition rate.

The resultant deposited film comprises TiN(C). The TiN (C) film is treated with a low frequency 350 kHz induced $N_2/H_2$ plasma generated by a high plasma power of 750 W. Such treatment reduces carbon concentration as described supra. The plasma treatment duration depends on the thickness of the TiN(C) film deposited. For a targeted thickness of 50 Å (1×50 process) the plasma treatment is about 35 s with a range of about 4 seconds to 40 seconds for titanium nitride thicknesses of about 5 Å to about 1000 Å.

A film can be deposited incrementally until the desired thickness is reached by repeating the thermal decomposition/deposition and plasma-treating steps. The plasma treatment duration depends on the thickness of the deposited film; each incremental thickness ranging from about 5 Å to about 50 Å with concomitant plasma treatment times of about 5 seconds to about 30 seconds. Additionally, a 50 Å film can be deposited in a 2×25 process. Here a layer of about 25 Å is deposited and subsequently plasma-treated for about 15 s, the deposition step is repeated for another 25 Å layer followed by another plasma treatment.

The TiN film is subsequently exposed to a silicon-containing gas ambient such as a silane soak to yield a TiSiN film having the silicon primarily incorporated as silicon nitride. The silane treatment is performed at a pressure from about 0.8 Torr to about 5 Torr. Little effect on the efficacy of the silane treatment is found due to the pressure. A pressure of about 1.3 Torr to about 2 Torr is used because, at these pressures, the delta pressure between the front and the back of the wafer is sufficient to vacuum chuck the wafer and avoid any wafer motion; 2 Torr provide better chucking efficiency. It is important to have a stable regime and not a transient one for this process. In the transition from the plasma treatment step to the silane treatment step the plasma treatment pressure needs to reduce or increase to the silane treatment pressure where silane flow is below 100 sccm and where treatment time is for only 10 s. A stable regime for these changes in conditions provides for reproducibility in the process.

EXAMPLE 2
XPS Analysis of a TiSiN Film

An X-ray photoelectron spectroscopy depth profile of a TiSiN layer with and without the $N_2/H_2$ plasma treatment is shown in Table 1. The oxygen found in the plasma treated TiSiN film is due to air exposure of the wafer samples. The pre-plasma TiN layer as deposited is very porous and amorphous. Plasma treatment of this layer transforms the amorphous film into a nanocrystalline film that is denser. Thus, plasma treatment eliminates the majority of carbon and oxygen from the film, the altered denser crystalline structure allows less silicon incorporation into plasma treated films.

TABLE 1

| | Film Composition (%) | | | | |
|---|---|---|---|---|---|
| | Ti | N | C | O | Si |
| TiSiN No Plasma | 28.5 | 21.2 | 28.8 | 14.5 | 7.0 |
| TiSiN Plasma | 40.5 | 48.2 | 5.6 | 1.4 | 4.4 |

An XPS profile can only show the elemental composition of the film and not how the elemental components are bonded within the film. Table 2 shows the possible bonding states of the elements in the TiSiN film without a plasma treatment prior to the silane soak or with said plasma treatment.

TABLE 2

| | Bonding State of Each Element | |
|---|---|---|
| | TiSiN No Plasma | TiSiN Plasma |
| Ti | TiN & (TiCx &/or TiOx) | TiN & TiCx |
| N | TiN | TiN & N—C—H |
| C | TiCx & C—C & (C—H) | TiCx |
| O | TiOx &/or TiCxOy | — |
| Si | SixNy | SixNy |

TDMAT is thermally decomposed at 360° C. and the decomposition products are deposited on the substrate. The decomposition reaction is:

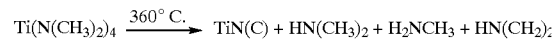

$Ti(N(CH_3)_2)_4 \xrightarrow{360°\,C.} TiN(C) + HN(CH_3)_2 + H_2NCH_3 + HN(CH_2)$;

Other hydrocarbons may be formed during this pyrolytic process. Note that oxygen is not an elemental byproduct of the pyrolytic decomposition of TDMAT. Oxygen is incorporated into the untreated film when the wafer is exposed to air.

The $N_2/H_2$ plasma treatment of the deposited film significantly reduces carbon and oxygen levels within the film. This creates a layer comprising TiCxNyHz which yields byproducts CxHy+HNR$_2$ that are subsequently pumped out of the chamber system. This scheme assumes that oxygen is not incorporated into the system. The resulting plasma-treated TiN film comprises a layer that is 50–60% of the as deposited thickness.

EXAMPLE 3
Silane Treatment vs. Sheet Resistance

In situ plasma treatment of TiN films improves film properties. The $N_2/H_2$ plasma treatment significantly reduces the amounts of carbon and oxygen in the film and thereby lowers resistivity. The post-treatment silane soak after standard MOCVD TiN deposition improves barrier properties. The silicon, as SiN, incorporated into the TiN film reduces oxidation of the film upon exposure to air also reducing resistivity of the TiSiN barrier layer.

Figure 3A:
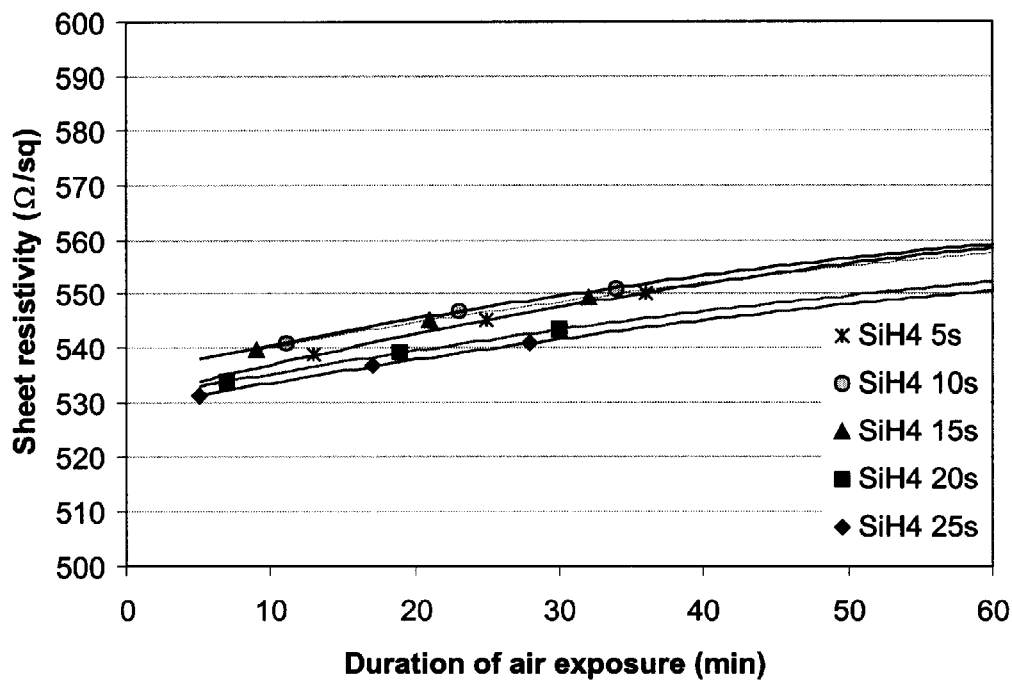
FIG. 3A: 30 sccm SiH4, 100 sccm N2 and 1.3 Torr.
Figure 3B:
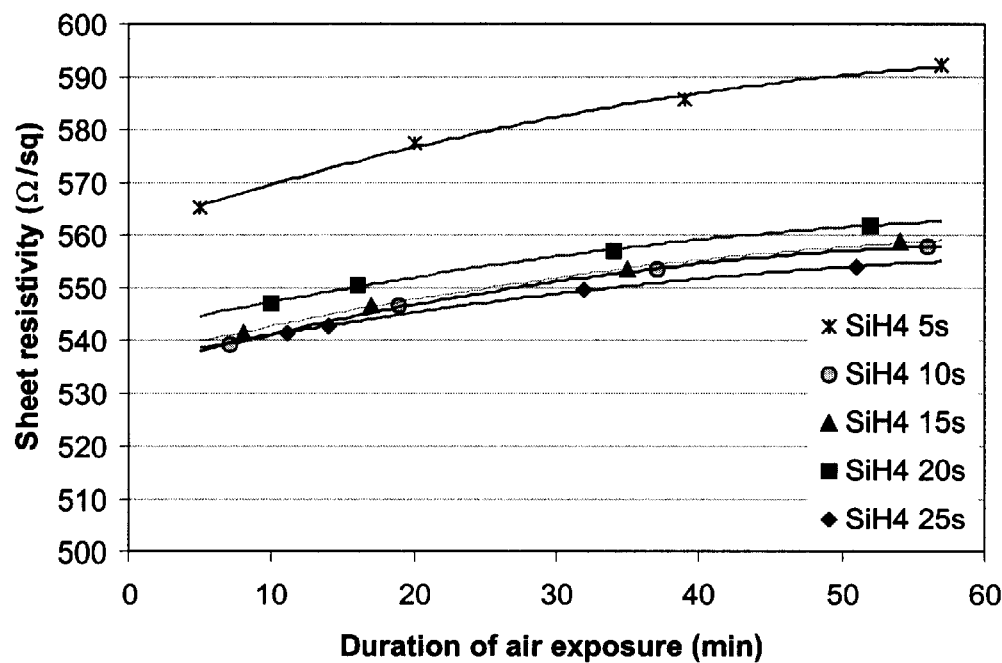
FIG. 3B: 80 sccm SiH4, 300 sccm N2 and 2 Torr.

TiN plasma-treated films exposed to silane for increasing amounts of time are tested for sheet resistance after air exposure (FIGS. 3A & 3B). The resistivity of a 1×50 Å film is reduced from about 650 $\mu\Omega$-cm to below 600 $\mu\Omega$-cm with silane exposure. Resistivity reduction stabilizes for ten seconds of silane exposure or more. FIG. 3B reinforces the importance of selection of the proper silane treatment conditions; higher silane flow and dilution achieves a higher front pressure of 2 Torr and is in a stable regime during the silane treatment of the wafer for chucking performances. A five second silane treatment at the higher flow rates and pressure of FIG. 3B resulted in a higher sheet resistance for any length of air exposure in comparison to the conditions used in FIG. 3A.

Figure 4A:
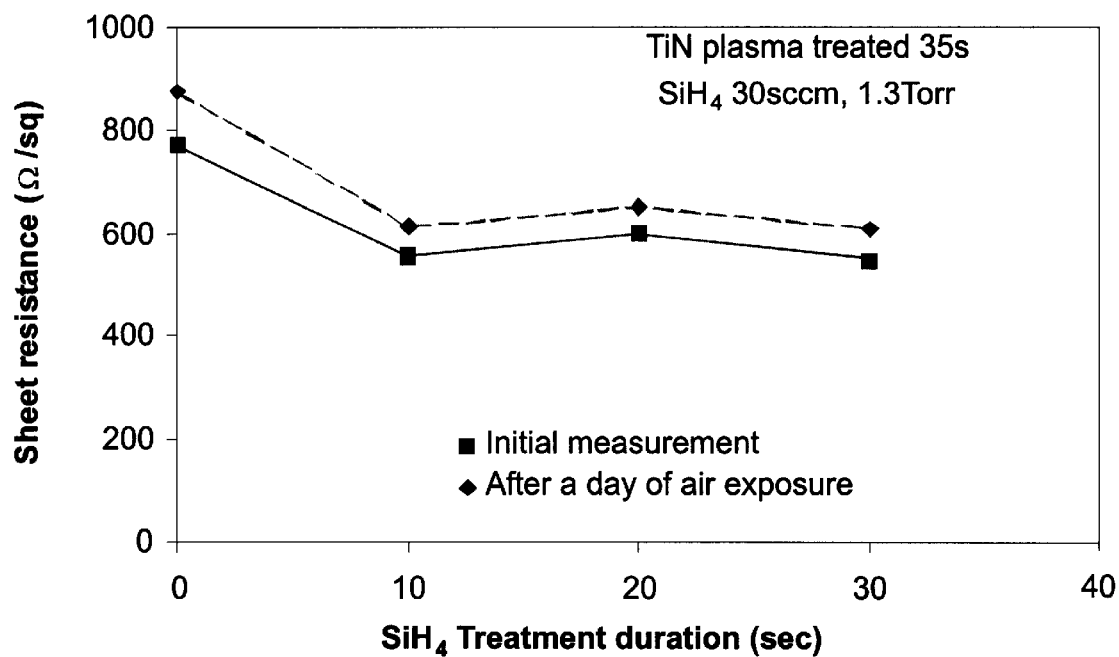
FIG. 4 measures sheet resistance as the duration of the silane treatment increases for plasma treated TiN film (FIG. 4A) and non-plasma treated TiN film (FIG. 4B) initially after silane treatment and after a day of air exposure. Silane treatment was performed with a flow rate of 30 sccm silane under 1.3 Torr pressure. Plasma exposure was 35 sec.
Figure 4B:
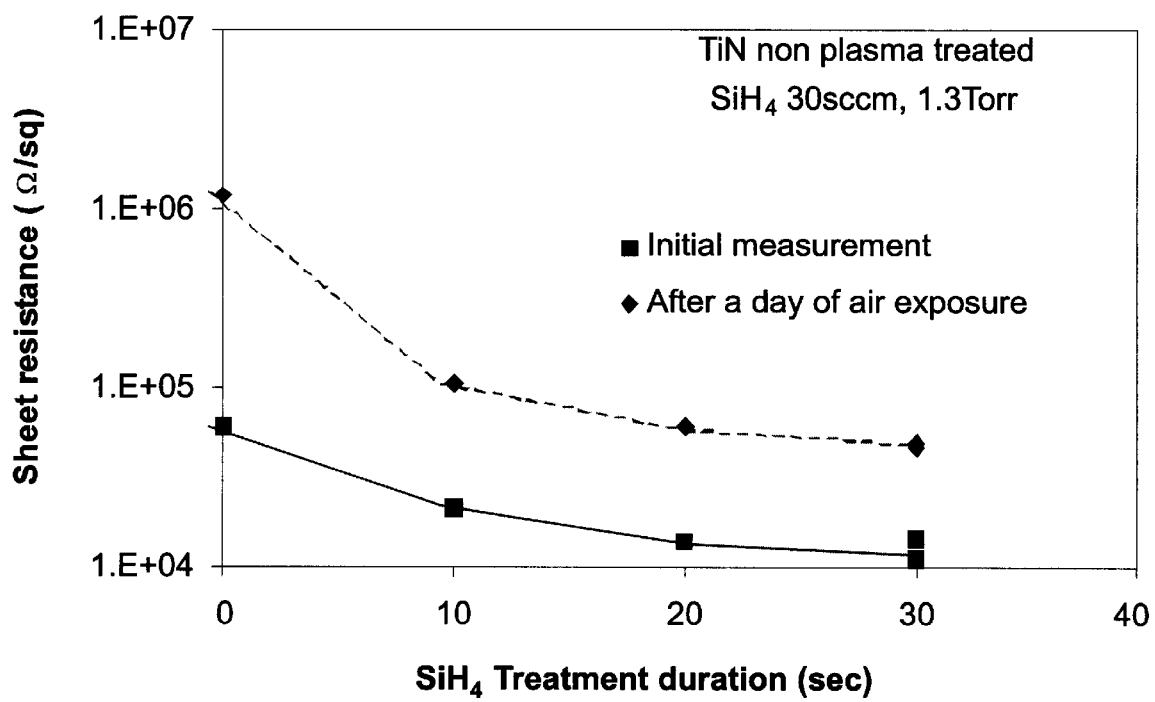

A silane soak reduces measured resistivity of both treated and untreated film. The sheet resistance of a TiN film plasma treated for 35 secs (FIG. 4A) is significantly less than that of the untreated TiN film (FIG. 4B) for any length of silane treatment duration. Again sheet resistance levels stabilize after about ten seconds of silane treatment. Sheet resistance after a day of air exposure is also measured. This demonstrates that the combination of a $N_2/H_2$ plasma treatment and a post-treatment silane soak is more effective at reducing oxidation and maintaining a lower sheet resistance of the film than a silane soak of an untreated TiN film.

EXAMPLE 4
Reduction of Sidewall Thickness

Figure 5:
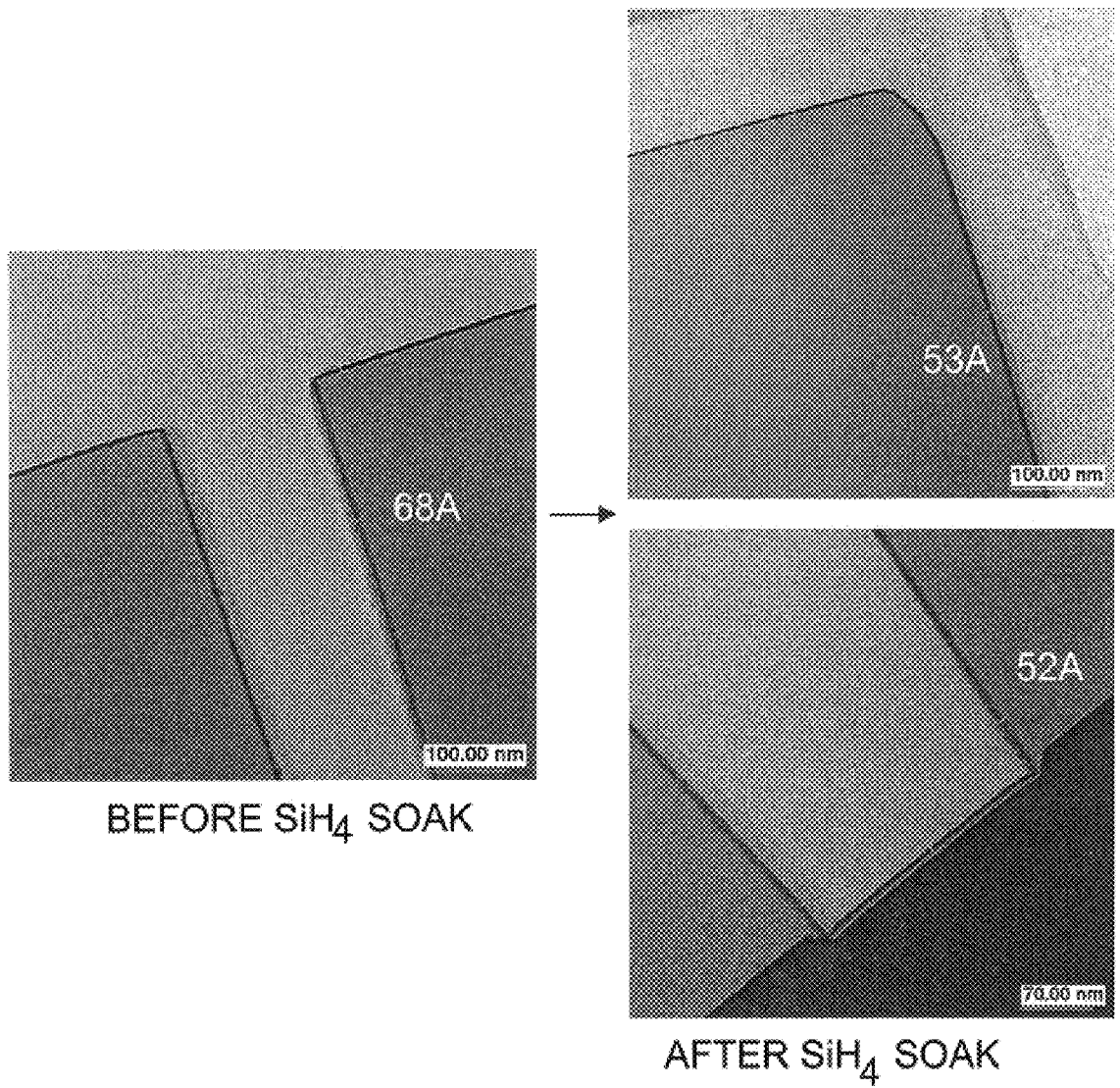
FIG. 5 shows a TEM of the bottom and corner coverage before and after a silane soak of the titanium nitride film.

A silane soak of a TiN film improves sidewall barrier properties; it also improves film stability of the sidewall, especially the less treated sidewall. A silane treatment reduces TiN sidewall thickness. FIG. 5 is a transmission electron micrograph showing that silane treatment of a plasma-treated TiN film yields good bottom and corner coverage and reduces the sidewall thickness from 68 Å to 52 Å. It is also apparent from the TEM that silane treatment of a TiN film produces a TiSiN film with good step coverage and a continuous smooth morphology along the bottom and sidewalls of the structure.

EXAMPLE 5

CVD TiSiN as a Copper Barrier Layer

Figure 6:
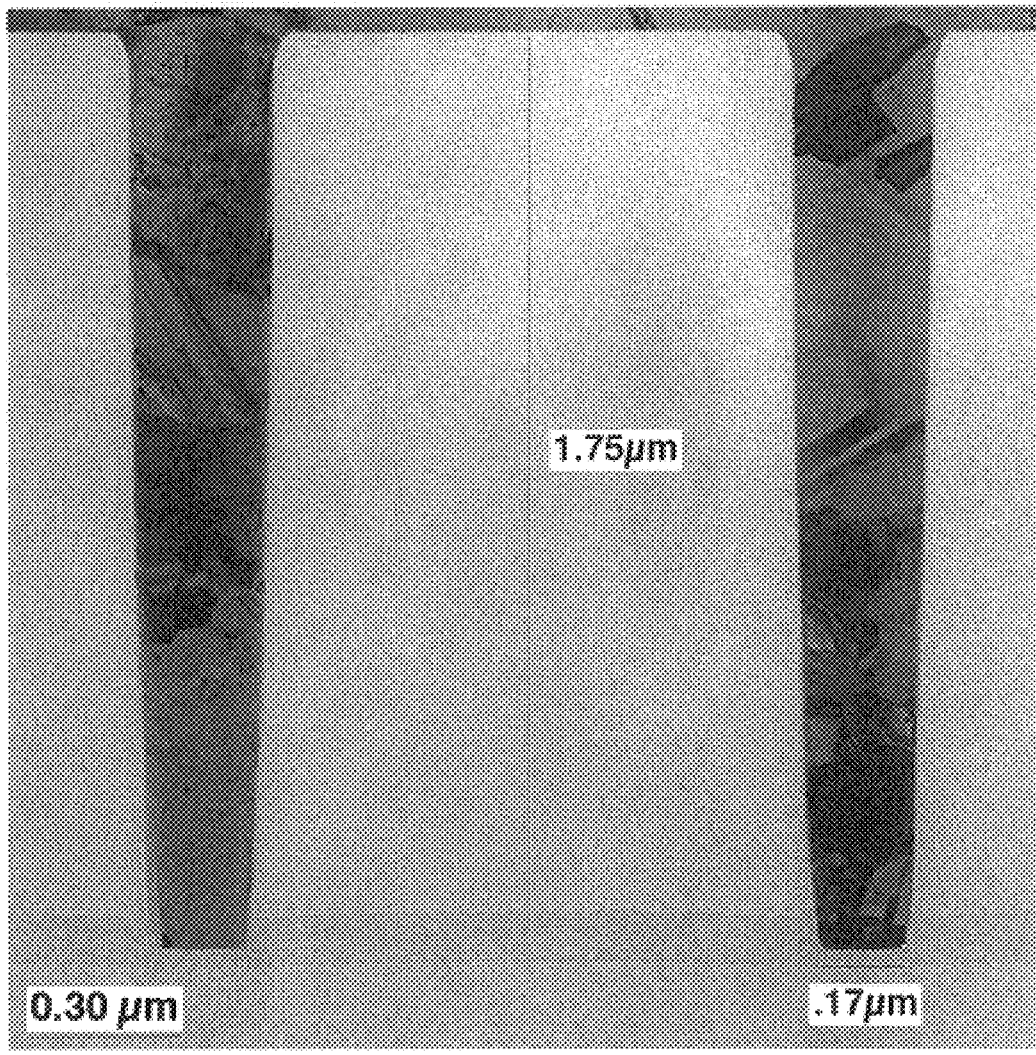
FIG. 6 shows a void-free 0.17 μm ECP copper fill at an aspect ratio of 10:1 with 1×50 Å TiSiN. Barrier/Seed: degas/100 Å pre-clean/50 Å TiSiN/2000 Å SIP copper.
Figure 7A:
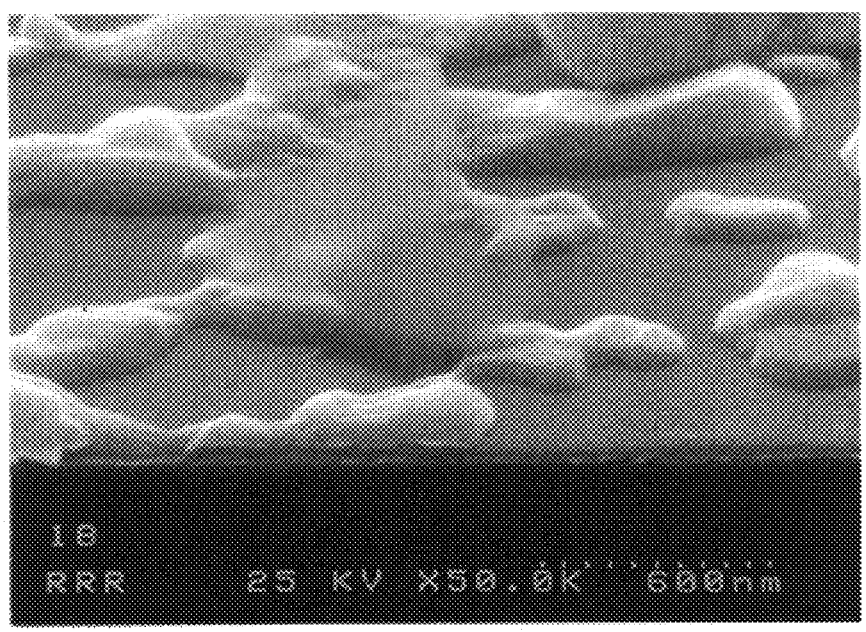
FIG. 7 depicts the wettability of 200 Å copper on 1×50 Å TiN (FIG. 7A) and on 1×50 Å TiSiN (FIG. 7B). Copper film is annealed at 380° C. for 15 min.
Figure 7B:
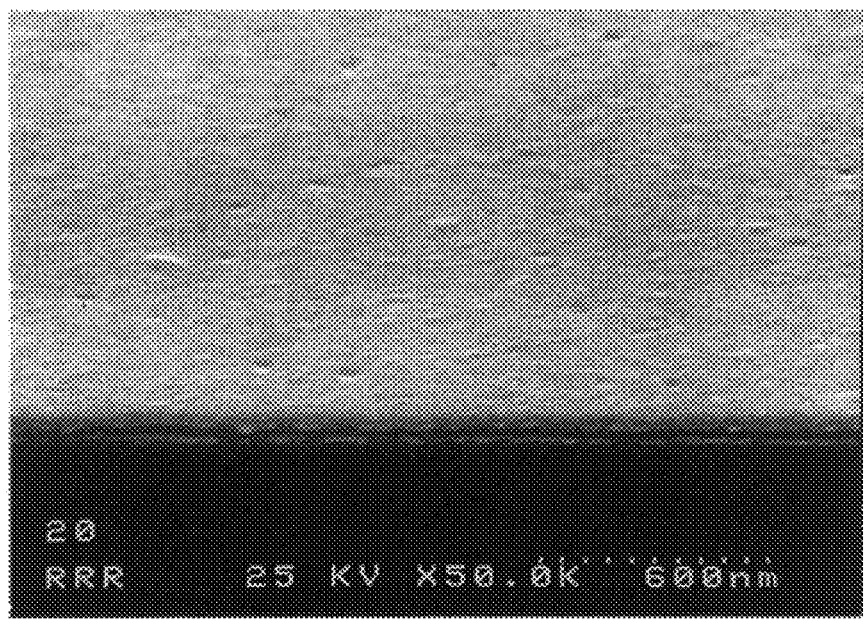

The continuous and smooth morphology of TiSiN films enhance the self-ionizing plasma (SIP) deposition of copper seed with electroplating (ECP) filling capability. FIG. 6 shows that an electroplating fill of 2 kÅ SIP copper on 1×50 Å TiSiN barrier can be void free in a 0.17 μm 10:1 aspect ratio structure. It is necessary to consider copper wettability at the Cu/barrier interface since this interface is the primary path for copper migration. Wettability of copper is also enhanced with a 1×50 Å TiNiS barrier layer. A 200 Å copper film annealed at 380° C. for 15 min. on 1×50 Å TiN showed dewetting (FIG. 7A) whereas the same copper film on a 1×50 Å TiNiS layer demonstrates no dewetting (FIG. 7B).

EXAMPLE 6

Sheet Resistance of Annealed SIP Copper on TiSiN

Silane treatment of TiN films improves the barrier properties of the films. However, an over-extended silane treatment of the TiN film can degrade copper resistivity causing the silicon to migrate inside the copper during annealing and thus leading to poor contact resistance. However if the TiN is not treated sufficiently, the material resistivity remains high and will give high contact resistance.

Figure 8:
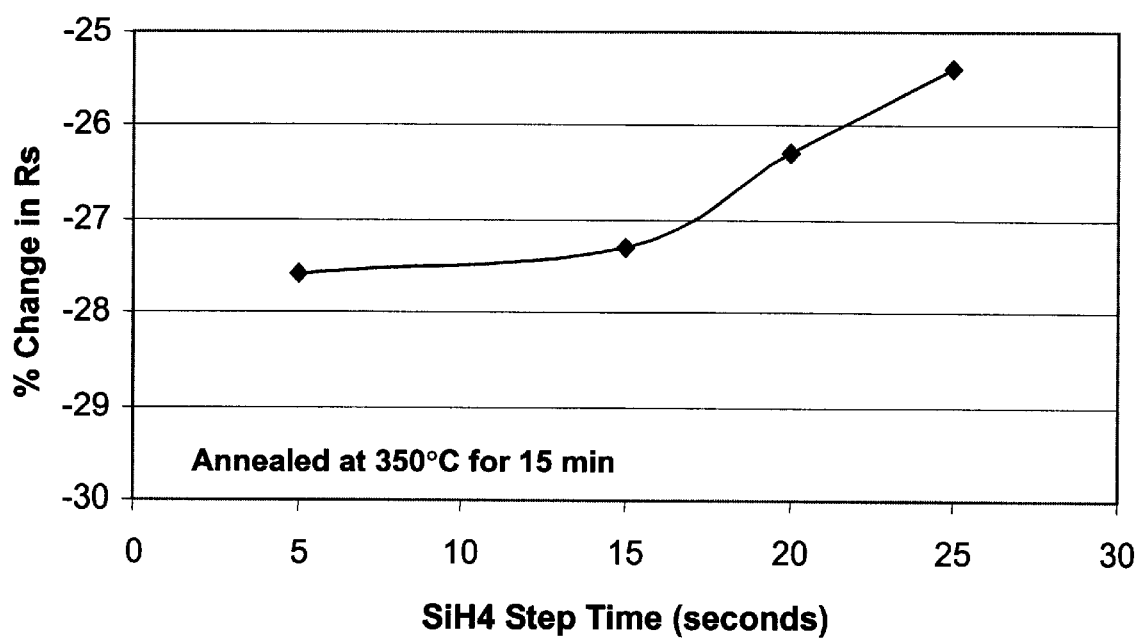
FIG. 8 shows the percent change in sheet resistance of annealed 500 Å SIP copper on TiSiN with increasing silane exposure. Process conditions are 80 sccm SiH4, 300 sccm N2 and 2 Torr.

FIG. 8 shows the percent change in sheet resistance with increasing silane exposure of an annealed 500 Å SIP copper. The copper was annealed at 380° C. for 15 min. The percent change in copper Rs on standard MOCVD TiN is about 26%. The copper sheet resistance is reduced after the anneal in all cases and the percent change decreases with increasing silane exposure.

EXAMPLE 7

TiSiN Barrier Performance Against Copper Diffusion

Figure 9:
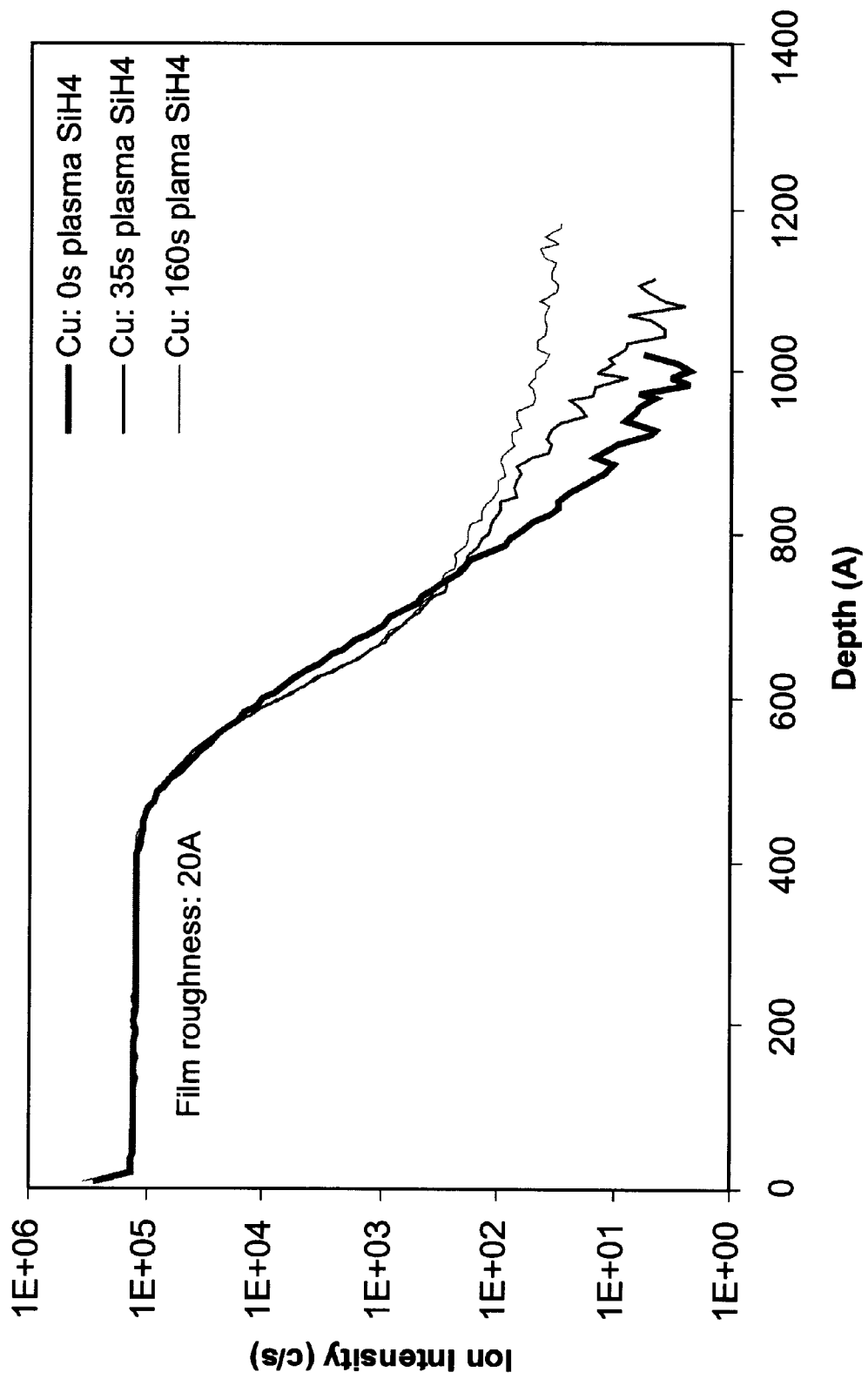
FIG. 9 is a SIMS profile of copper diffusion through TiSiN plasma treated for various times and then silane. Film stack: 500 Å SIP Cu/50 Å TiN (split)/3 kÅ oxide/Si, annealed at 380° C. for 30 min.

TiSiN showed good barrier properties for oxide. A SIMS profile of an annealed SIP Cu/TiSiN/oxide stack demonstrates that silane soaked TiN layers with or without plasma treatment significantly impeded copper diffusion into the oxide substrate (FIG. 9). Again this demonstrates the tunable relationship between plasma-treatment duration and silane treatment duration. The less plasma-treated layers impede copper diffusion better than those of longer plasma treatment duration. The barrier efficiency is related to the formation of silicon nitride in the TiN film; i.e., as explained supra, the longer the plasma duration, the less carbon in the film and, therefore, the less SiN formed upon silane exposure.

A comparison of actual barrier performance between TiSiN and IMP Ta 50 Å films in a capacitor BTS test showed similar mean-times-to-failure (MTTF) (data not shown).

EXAMPLE 8

TiSiN Adhesion on SIP Copper

IMP TaN provides an excellent barrier layer for SIP copper. In comparison with IMP TaN, TiSiN demonstrates good adhesion on SIP copper. TiSiN on SIP copper also has similar reflectivity characteristics as SIP copper on a TaN film. The reflectivity values for 1×50 Å TiSiN with or without plasma treatment but with silane treatment are practically identical; it is the silane treatment, the incorporation of SiN into the TiN layer that is improving barrier properties. This is further reinforced by comparing the reflectivity values of a plasma treated TiN film with the those of the TiSiN films. Reflectivity is less than either the TiSiN films or the IMP TaN film. Table 3 summarizes the results of the reflectivity and adhesion tests.

TABLE 3

Reflectivity and Adhesion of 500 Å SIP Copper

|  | Reflectivity before anneal 480 nm | | *Adhesion After anneal 436 nm |
| --- | --- | --- | --- |
| IMP TaN 250 Å/SIP 500 Å | 132.04 | 119.94 | Pass |
| TiN 1 × 50 Å Plasma 35 s/SIP 500 Å | 116.79 | 105.05 | Pass |
| TiSiN 1 × 50 Å Plasma 0 s SiH4/SIP 500 Å | 127.79 | 116.13 | Pass |
| TiSiN 1 × 50 Å Plasma 35 s SiH4/SIP 500 Å | 127.09 | 115.88 | Pass |

*Pass scribe and scotch tape test

EXAMPLE 9

Repeatability of TiSiN Process-5000 Wafer Run

Figure 10A:
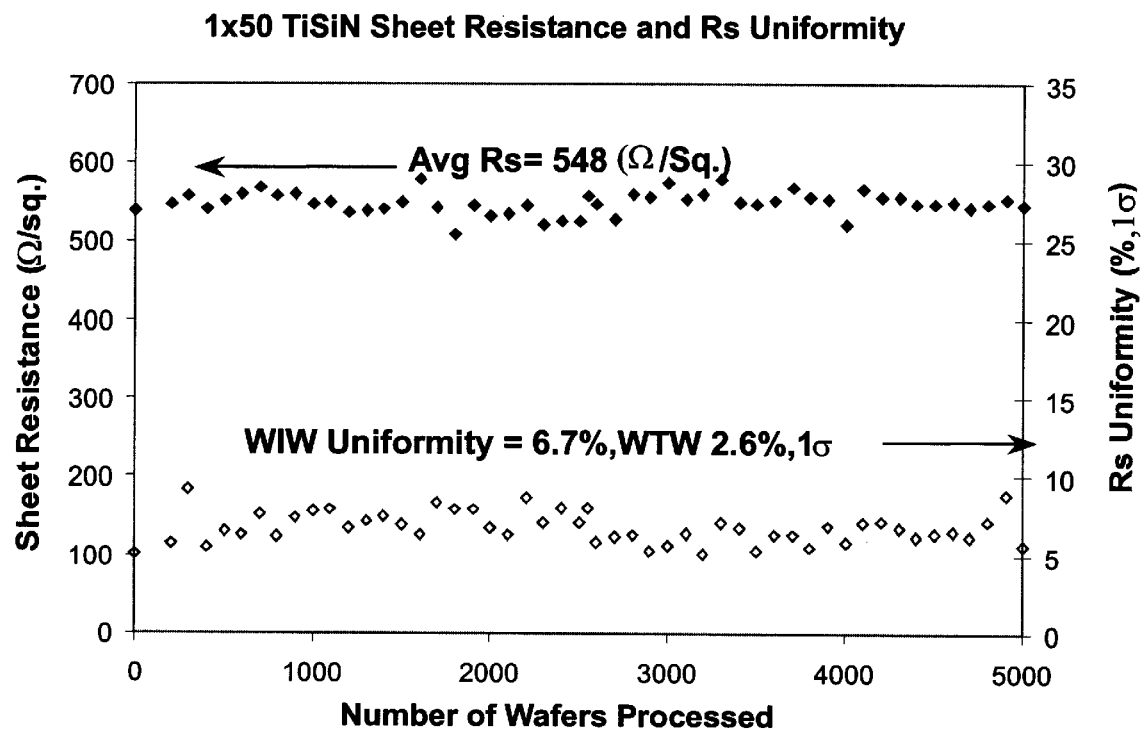
FIG. 10 shows the WIW and WTW sheet resistance uniformity for 1×50 Å TiSiN films (FIG. 10A) and 1×35 Å TiSiN films (FIG. 10B) for a 5000 wafer run. Wafers had a 3 mm edge exclusion.
Figure 10B:
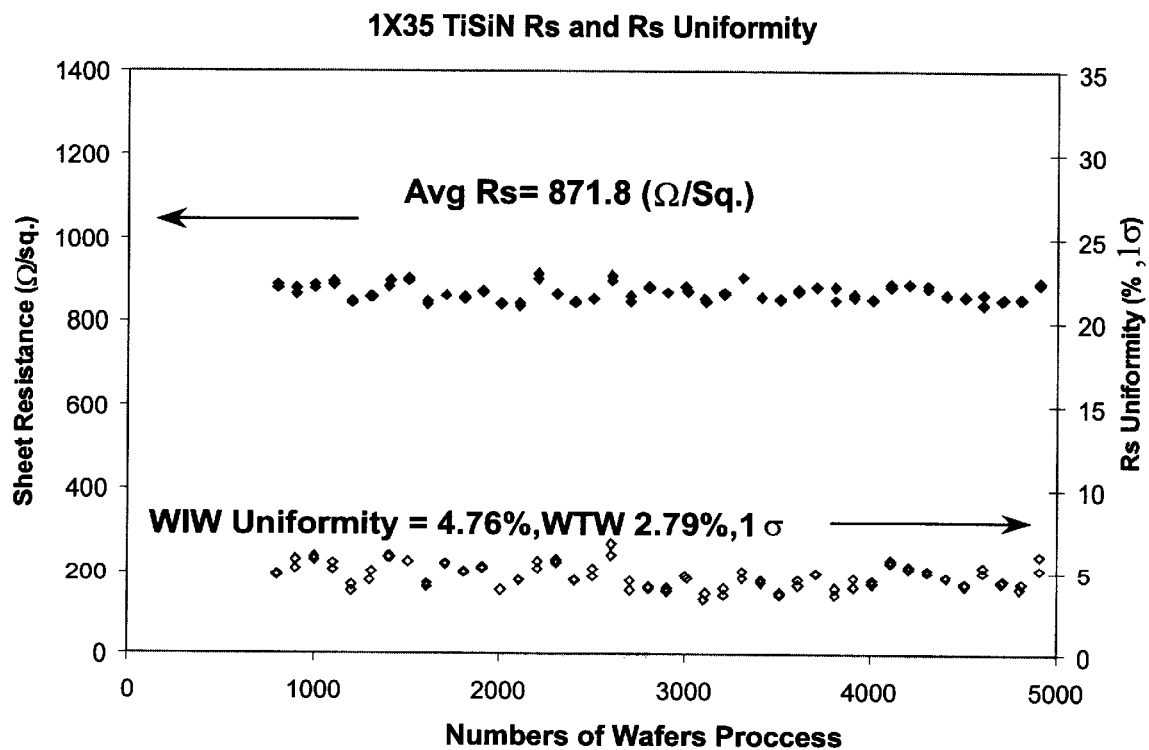
Figure 11A:
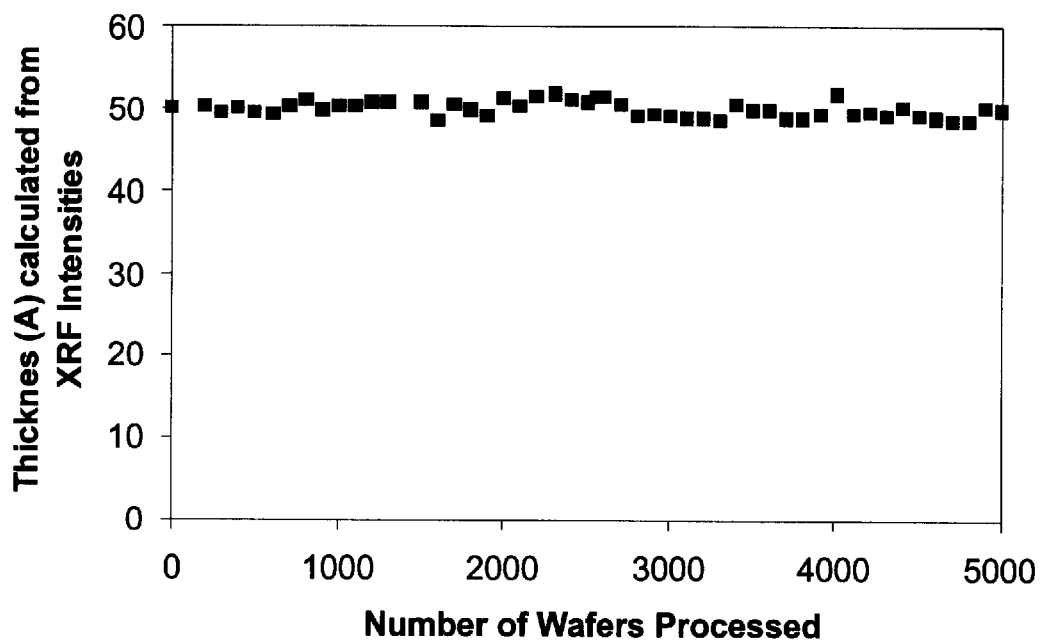
FIG. 11 shows the WIW and WTW thickness uniformity for 1×50 Å TiSiN films (FIG. 11A) and 1×35 Å TiSiN films (FIG. 11B) for a 5000 wafer run. Thicknesses are calculated from XRF intensities.
Figure 11B:
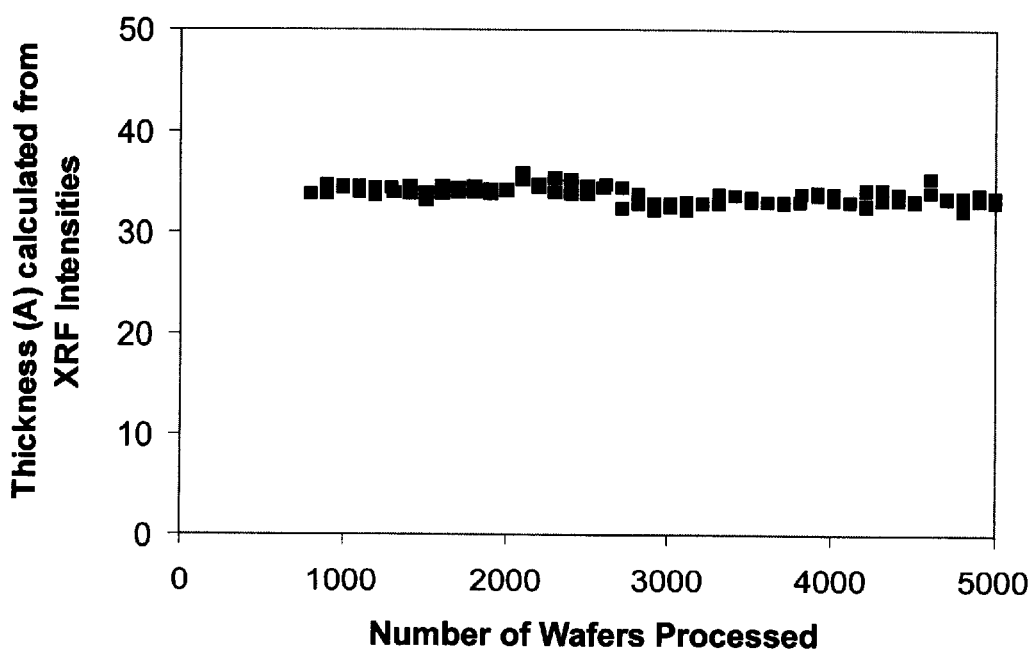

Over the course of a 5000 wafer run the TiSiN process maintains sheet resistance uniformity (FIGS. 10A and 10B) and thickness uniformity (FIGS. 11A and 11B) for within wafer (WIW) and wafer to wafer (WTW) measurements. Comparing a 1×50 Å TiSiN film with a 1×35 Å TiSiN film shows that the thinner film has a slightly improved sheet resistance uniformity within wafer, but the wafer to wafer uniformity over the 5000 wafer run is almost identical. The low bulk resistivity of the 1×50 Å TiSiN film is about 273 μΩ-cm.

Thickness uniformity for the 1×50 Å and 1×35 Å TiSiN films is calculated from XRF intensities. Wafer to wafer thickness uniformity for both of these films is excellent and is almost identical for the 5000 wafer run. Table 4 summarizes these results.

TABLE 4

| | UNIFORMITY | | | |
| --- | --- | --- | --- | --- |
| | Sheet Resistance | | Thickness | |
| TiSiN Film | WIW, % | WTW, % 1σ | WIW, % | WTW, % 1σ |
| 1 × 50 Å | 6.7 | 2.6 | — | 2.3 |
| 1 × 35 Å | 4.8 | 2.8 | — | 2.5 |

Figure 12A:
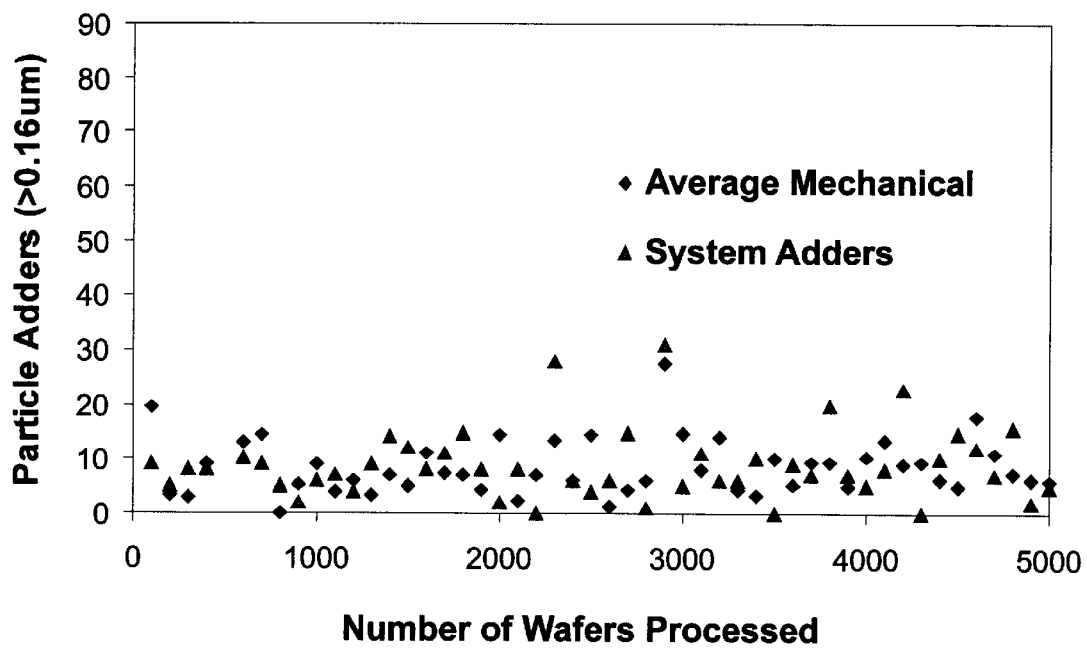
FIG. 12 shows the average mechanical and system adders (FIG. 12A) and the average in-film particles and system adders (FIG. 12B) at >0.16 μm for a 5000 wafer run.
Figure 12B:
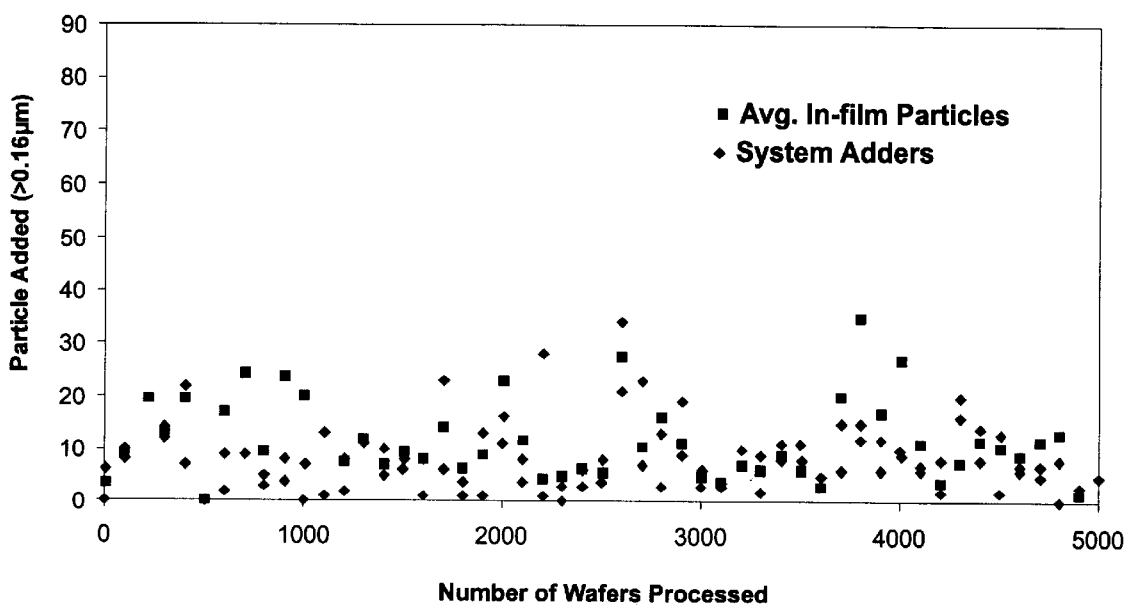

The average number of mechanical particle defects added (mechanical adders) to a wafer after processing for a ≧0.16 μm feature remains low for all 5000 wafers at 9.9 (FIG. 12A). The average number of in-film particle defects (particle adders) is also relatively constant at 15 adders for >0.16 μm feature (FIG. 12B), although since this measurement is taken after film deposition, the variation over the course of the 5000 wafer run is reasonably greater than that for mechanical adders. The number of system adders for both mechanical and in-film determinations is 10.

EXAMPLE 10

Effect of Chamber Idle Time

Figure 13A:
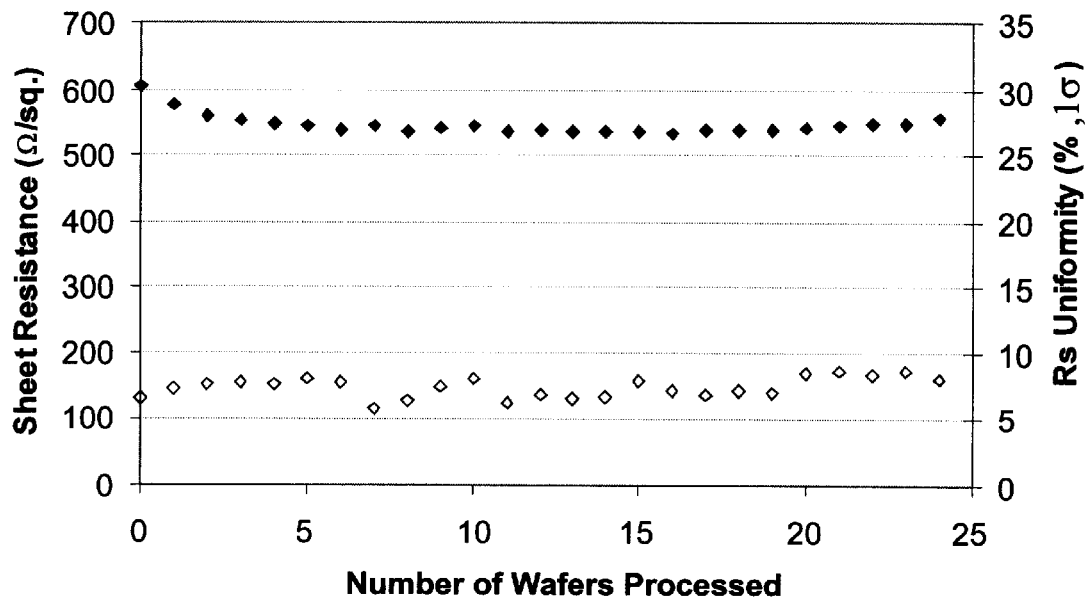
FIG. 13 shows the effect of one hour of chamber idle time on wafer processing for the sheet resistance and resistance uniformity (FIG. 13A) and the film thickness (FIG. 13B) for 1×50 Å film.
Figure 13B:
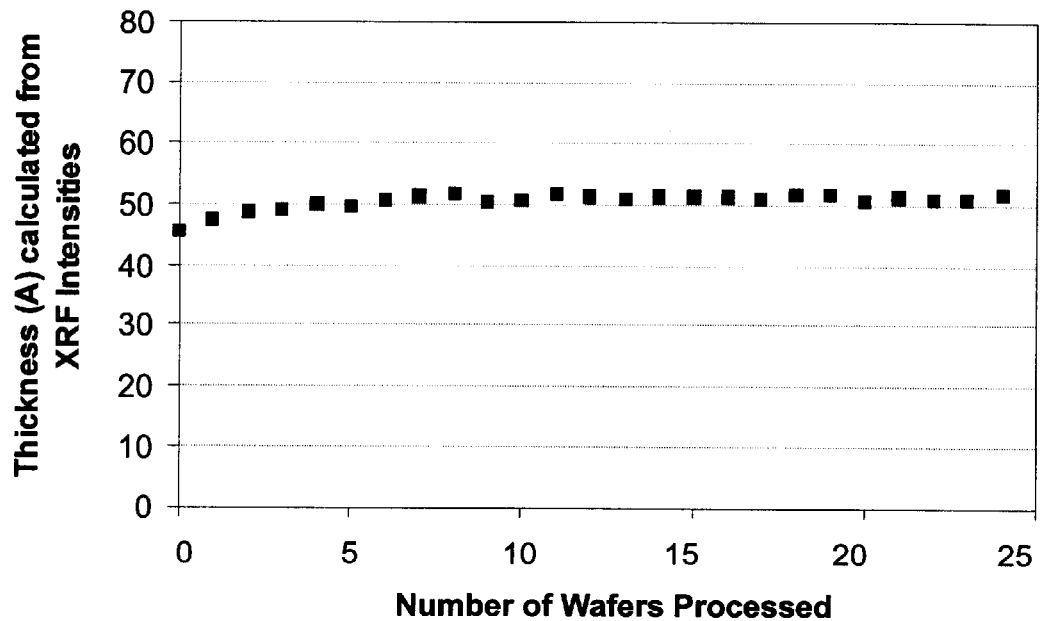

The chamber appartus used for the formation of TiSiN films exhibits rapid chamber recovery from idle time. FIG. 13A shows that sheet resistance declines to under 600 Ω/sq and remains constant after three wafers are processed; Rs uniformity also remains constant at an average of approximately 7%, 1 σ. FIG. 13B indicates that a 50 Å film thickness is achieved and maintained after only three wafers. Therefore, few wafers are lost waiting for the chamber to recover thus insuring a higher yield.

The following references are relied upon herein:
1. J. -P. Lu. Process for Fabricating Conformal Ti—Si—N and Ti—B—N Based Barrier Films with Low Defect Density. U.S. Ser. No. 6,017,818 (Jan. 25, 2000).
2. Hsu, W. -Y., Hong, Q. -Z. and Lu, J. -P. Barrier/Liner with a SiNx-Enriched Surface Layer on MOCVD Prepared Films. U.S. Ser. No. 6,037,013 (Mar. 14, 2000).
3. S. Lopatin. Low Resistivity Semiconductor Barrier Layers and Manufacturing Method Therefor. U.S. Ser. No. 6,144,096 (Nov. 7, 2000.)
4. K. Ngan and S. Ramaswami. Method of Producing Smooth Titanium Nitride Films Having Low Resistivity. U.S. Ser. No. 6,149,777 (Nov. 21, 2000).
5. T. Harada, S. Hirao, S. Fujii, S. Hashimoto, and M. Shishino. *Surface Modification of MOCVD-TiN Film by Plasma Treatment and SiH4 Exposure for Cu Interconects*. Materials Research Society Conference Proceedings ULSI XIV, pp. 329–335 (1999).

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of forming a titanium silicon nitride barrier layer on a semiconductor wafer, comprising the steps of:
   (a) depositing a titanium nitride layer on the semiconductor wafer;
   (b) plasma-treating the titanium nitride layer in a $N_2/H_2$ plasma; and
   (c) exposing the plasma-treated titanium nitride layer to a silicon-containing gas ambient, wherein silicon is incorporated into the titanium nitride layer as silicon nitride thereby forming a titanium silicon nitride barrier layer.

2. The method of claim 1, wherein the deposition of the titanium nitride layer comprises the steps of:
   (a) vaporizing a metalorganic titanium/nitrogen-containing compound;
   (b) introducing the vaporized titanium/nitrogen-containing compound into a deposition chamber of a CVD) apparatus;
   (c) maintaining the deposition chamber at a pressure and the wafer at a temperature suitable for the high pressure chemical vapor deposition of the titanium nitride layer onto the wafer;
   (d) thermally decomposing the titanium/nitrogen-containing gas in the deposition chamber; and
   (e) vapor-depositing the titanium nitride layer onto the wafer.

3. The method of claim 2, wherein the titanium nitride layer has a thickness of about 5 Å to about 100 Å.

4. The method of claim 2, wherein the metalorganic titanium/nitrogen-containing compound comprises tetrakisdimethylamino titanium or tetrakisdiethylamino titanium.

5. The method of claim 2, wherein the chamber pressure is from about 1 Torr to about 10 Torr.

6. The method of claim 2, wherein the wafer temperature is from about 320° C. to about 370° C.

7. The method of claim 1, wherein the plasma treating step occurs at a plasma power of about 600W to about 1500W.

8. The method of claim 1, wherein the titanium nitride layer is plasma treated for about 4 seconds to about 40 seconds.

9. The method of claim 1, wherein the silicon-containing gas comprises silane, disilane, methylsilane, or dimethylsilane.

10. The method of claim 1, wherein the exposure to the silicon-containing gas ambient is from about 4 seconds to about 20 seconds.

11. The method of claim 1, wherein a cycle of the steps comprising depositing the titanium nitride layer and plasma-treating the deposited titanium nitride layer is repeated with no intervening step thereby depositing the titanium nitride layer incrementally prior to exposing the titanium nitride layer to the silicon-containing gas ambient.

12. A method of forming a titanium silicon nitride barrier layer on a semiconductor wafer, comprising the steps of:
   (a) vaporizing tetrakisdimethylamino titanium;
   (b) introducing the vaporized tetrakisdimethylamino titanium into a deposition chamber of a CVD apparatus;
   (c) maintaining the deposition chamber at a pressure of about 5 Torr and the wafer at a temperature of about 360° C.;
   (d) thermally decomposing the tetrakisdimethylamino titanium gas in the deposition chamber;
   (e) vapor-depositing the titanium nitride film onto the wafer;
   (f) plasma-treating the titanium nitride layer in a $N_2/H_2$ plasma at a plasma power of about 750W for about 15 seconds wherein a titanium nitride layer having a thickness of about 25 Å is formed;
   (g) repeating steps (a) through (f) wherein a second titanium nitride layer having a thickness of about 25 Å is formed directly on the first deposited titanium nitride layer thereby forming a titanium nitride layer having a total thickness of 50 Å; and
   (h) exposing the plasma-treated titanium nitride layer to a silane gas ambient for about 10 seconds, wherein silicon is incorporated into the titanium nitride layer as silicon nitride thereby forming a titanium silicon nitride barrier layer.

13. A method of improving the barrier performance of a titanium nitride layer comprising the steps of:
   introducing silicon into the titanium nitride layer such that the silicon is incorporated into the titanium nitride layer as silicon nitride wherein the barrier performance of the titanium nitride layer is improved.

14. The method of claim 13, wherein the introduction of silicon into the titanium nitride layer as silicon nitride comprises the steps of:
   (a) vaporizing a metalorganic titanium/nitrogen-containing compound;
   (b) introducing the vaporized titanium/nitrogen-containing compound into a deposition chamber of a CVD apparatus;
   (c) maintaining the deposition chamber at a pressure and the wafer at a temperature suitable for the high pressure chemical vapor deposition of the titanium nitride film onto the wafer;
   (d) thermally decomposing the titanium/nitrogen-containing gas in the deposition chamber;
   (e) vapor-depositing the titanium nitride film onto the wafer;
   (f) plasma treating the titanium nitride layer in a $N_2/H_2$ plasma; and
   (g) exposing the plasma-treated titanium nitride layer to a silicon-containing gas ambient, wherein silicon is incorporated into the titanium nitride layer as silicon nitride.

15. The method of claim 14, wherein the metalorganic titanium/nitrogen-containing compound comprises tetrakisdimethylamino titanium or tetrakisdiethylamino titanium.

16. The method of claim 14, wherein the silicon-containing gas comprises silane, disilane, methylsilane or dimethylsilane.

17. The method of claim 14, wherein a cycle of the steps (d) through (f) is repeated with no intervening step thereby depositing a titanium nitride layer incrementally prior to exposing the deposited titanium nitride layer to the silane ambient of step (g).

18. A method of improving the barrier performance of a titanium nitride layer comprising the steps of:
   (a) vaporizing tetrakisdimethylamino titanium;
   (b) introducing the vaporized tetrakisdimethylamino titanium into a deposition chamber of a CVD apparatus;
   (c) maintaining the deposition chamber at a pressure of about 5 Torr and the wafer at a temperature of about 360° C.;
   (d) thermally decomposing the tetrakisdimethylamino titanium in the deposition chamber;
   (e) vapor-depositing the titanium nitride film onto the wafer;
   (f) plasma-treating the titanium nitride layer in a $N_2/H_2$ plasma at a plasma power of about 750W for about 15 seconds wherein a titanium nitride layer having a thickness of about 25 Å is formed;
   (g) repeating steps (a) through (f) wherein a second titanium nitride layer having a thickness of about 25 Å is formed directly on the first deposited titanium nitride layer thereby forming a titanium nitride layer having a total thickness of 50 Å; and
   (h) exposing the plasma-treated titanium nitride layer to a silane gas ambient for about 10 seconds, wherein silicon is incorporated into the titanium nitride layer as silicon nitride thereby improving the barrier performance of the titanium nitride layer.

19. A method of integrating copper into a semiconductor device comprising the steps of:
   forming a titanium silicon nitride barrier in a feature of the semiconductor device by the method of claim 1;
   and depositing a copper layer over the titanium silicon nitride barrier thereby integrating copper into the semiconductor device.

20. A method of improving copper wettability at an interface of a copper layer and a titanium nitride layer in a semiconductor device comprising the steps of:
   introducing silicon into the titanium nitride layer as silicon nitride by the method of claim 1 such that a titanium silicon nitride layer is formed; and
   depositing a copper layer over the titanium silicon nitride layer wherein copper wettability at the interface of the copper layer and the titanium silicon nitride layer is improved over copper wettability at the copper/titanium nitride interface.

* * * * *